United States Patent [19]
Wakui

[11] Patent Number: 5,653,317
[45] Date of Patent: Aug. 5, 1997

[54] VIBRATION REMOVING APPARATUS AND METHOD THEREOF

[75] Inventor: Shinji Wakui, Utsunomiya, Japan

[73] Assignee: Canon Kabushiki Kaisha, Tokyo, Japan

[21] Appl. No.: 622,001

[22] Filed: Mar. 26, 1996

[30] Foreign Application Priority Data

Mar. 28, 1995 [JP] Japan ..................... 7-093192

[51] Int. Cl.$^6$ ........................... F16M 13/00
[52] U.S. Cl. .................. 188/378; 248/550; 267/136
[58] Field of Search ................... 188/378, 379, 188/380; 248/550; 267/136; 414/676; 318/568.17; 108/136

[56] References Cited

U.S. PATENT DOCUMENTS

| 5,478,043 | 12/1995 | Wakui ..................... 188/378 |
| 5,504,407 | 4/1996 | Wakui et al. ............. 318/568.17 |
| 5,511,930 | 4/1996 | Sato et al. ............... 414/676 |

FOREIGN PATENT DOCUMENTS

| 6-181158 | 6/1994 | Japan. |
| 6-216003 | 8/1994 | Japan. |

Primary Examiner—Douglas C. Butler
Attorney, Agent, or Firm—Fitzpatrick, Cella, Harper & Scinto

[57] ABSTRACT

An active vibration removing apparatus having an air-spring as an actuator, includes: a vibration removing table, a supporting air-spring for supporting the vibration removing table, a servo-valve for adjusting the pressure of the air-spring, and a feedback system for controlling the servo-valve. A pseudo-differentiator pseudo-differentiates a speed adjustment signal of a device placed on the vibration removing table. A pulse selector for selects an arbitrary numbers of pulse waveforms from a series of pulse waveforms outputted from the pseudo-differentiator. The output of the pulse selector is feedforwarded in the feedback system.

34 Claims, 16 Drawing Sheets

VIBRATION REMOVING APPARATUS AND METHOD THEREOF

BACKGROUND OF THE INVENTION

The present invention relates to a vibration removing apparatus particularly suitable to be used as a unit constituting an exposure apparatus in a semiconductor manufacturing apparatus having an XY platform. More particularly, the present invention relates to an improvement of an air-spring vibration removing apparatus which is capable of effective suppression of vibrations caused by movement of a device that is placed on the exposure apparatus.

Generally, devices that are susceptible to vibrations such as an optical microscope or an XY platform for exposure are placed on a vibration removing table of a vibration removing apparatus. Particularly for an XY platform used for exposure, vibrations externally transmitted must be removed from a vibration removing table as much as possible. This is because the XY platform for exposure must be still when exposure is executed.

Further, attention must be to the intermittent operation of an XY platform for exposure, called a "step & repeat" operation, which repeatedly generates step vibrations on its own and to the vibrations generated by the "step & repeat" operation on the vibration removing table.

An exposing operation should not be started before such vibrations are removed. Therefore, for a vibration removing table, removal of externally transmitted vibrations and controlling of forced vibrations caused by movement of a device placed on the vibration removing table must be balanced.

As a vibration removing table, a passive vibration removing table and an active vibration removing table are known. Lately, an active vibration removing table is more frequently used in order to satisfy the need for precise positioning, precise scanning and fast movement.

For an actuator used for an active vibration removing apparatus, there are an air-spring, a voice-coil actuator and a piezoelectric element. The present invention relates to an air-spring vibration removing apparatus utilizing an air-spring as an actuator and a description thereof will be provided below.

FIG. 3 shows a structure of a conventional air-spring vibration removing apparatus. In FIG. 3, reference numeral 1 denotes an air-spring supporting leg; 2 denotes a servo-valve for aspirating and evacuating air which functions as an operation fluid of an air spring 3; 4 denotes a position sensor for measuring a vertical displacement of a vibration removing table 5; 6 denotes a pressurizing mechanical spring, 7 denotes a viscosity element for expressing viscosity of the air spring 3, for the pressurizing mechanical spring 6, and for an entire structure (not shown); 8 denotes a feedback apparatus; 9, an acceleration sensor; 10 denotes a filter comprising a low-pass filter and a band-pass filter; 11 denotes a voltage-current converter; 12 denotes a displacement amplifier, 13 denotes a comparator, 14 denotes a reference voltage; and 15 denotes a PI compensator. Hereinafter, the combination of the air-spring supporting leg 1 and the feedback apparatus 8 will be referred to as an air-spring vibration removing apparatus. For the purpose of a simple explanation, only one vertical axis is illustrated for the air-spring vibration removing apparatus. The structure of the apparatus is identical in the horizontal direction. An apparatus structured with a plurality of the air-spring supporting legs 1 and a plane plate placed on each of the vibration removing table 5 is also referred to as an air-spring vibration removing apparatus.

Next, the structure and the operation of the feedback apparatus 8 for the air-spring supporting leg 1 will be described. An output of the acceleration sensor 9 is inputted as a negative feedback circuit to a preceding stage of the voltage-current converter 11, which generates current for opening and closing of the servo-valve 2 via the filter 10 having an appropriate amplification and a time constant. The mechanism is stabilized by the acceleration feedback loop. In other words, damping is provided. Further, an output of the position sensor 4 is sent through the displacement amplifier 12 and inputted to the comparator 13. The comparator 13 compares an output of the displacement amplifier 12 with the reference voltage 14, which is equivalent to the target position of the vibration removing table 5, and an error signal $\underline{e}$ is outputted. This error signal $\underline{e}$ is sent through the PI compensator 15 to obtain a control voltage and inputted to the voltage-current converter 11. The voltage-current converter 11 outputs a current corresponding to the control voltage, control opening and closing of the servo-valve 2, and adjusts the pressure of the air spring 3. As a result, the vibration removing table 5 is maintained at a desired position that has been designated by the reference voltage 14 without a steady-state error. Herein, "P" in the PI compensator 15 denotes a proportional action and "I", an integral action.

When a device placed on the vibration removing table 5 repeats intermittent operations, the reaction force thereof causes vibrations on the vibration removing table 5. Since the patterns of the intermittent operations of the placed device are already known, an appropriate compensation is applied to a driving signal which drives the intermittent operations and an output thereof is feedforwarded to the air spring 3 which is an actuator of the vibration removing table 5, in order to suppress vibrations of the vibration removing table 5.

As prior art, Japanese Patent Application Laid-Open (KOKAI) No. 6-216003 (entitled "Stage Device") and Japanese Patent Application Laid-Open (KOKAI) No. 6-81158 (entitled "Controller of Vibration-Removing Table") are known.

Japanese Patent Application Laid-Open (KOKAI) No. 6-216003 discloses a general concept in which displacement information of an XY platform is provided from an XY platform control portion to a vibration-removing control portion of a vibration-proof platform control system, and vibrations of the vibration-proof platform, caused by an operation of the XY platform placed on the vibration-proof platform, are controlled. Herein, the vibration-proof platform is what is called the vibration removing table in the present specification. The displacement information of the XY platform includes information, such as coordinates of the XY platform measured by a laser interferometer, velocity data of the XY platform based on each velocity data generated by a driving motor, and a driving voltage provided to the driving motor.

This conventional art discloses the concept of obtaining information from a signal driving the XY platform to control vibrations of the vibration removing table; however, no concrete structure of an apparatus is disclosed which explains how the information is processed to control vibrations of the vibration removing table.

Japanese Patent Application Laid-Open (KOKAI) No. 6-181158 suggests a control apparatus of an air-spring vibration removing table where a pseudo-differentiator is applied to a driving signal which is to be sent to a device placed on the vibration removing table 5; and an output signal thereof is lead to a supporting-input-terminal, which is arranged in a preceding stage of the current-voltage converter 11, which drives the servo valve 2, in order to control vibrations of the vibration removing table 5 caused by motion of the device. Described hereinafter is a theory of feedforward compensation based on a driving signal of a placed device to be applied to vibrations of a vibration removing table.

FIG. 4 shows a servo block diagram of the conventional air-spring vibration removing apparatus illustrated in FIG. 3. Referring to the reference numerals in FIG. 4, a relationship among a displacement x, a reference value $r_o$, a disturbance $f_{dis}$ and a supporting input $v_{FF}$ can be expressed as follows.

$$x = \frac{\delta K_I(1+sT)}{d(s)} r_0 + \frac{s^2T}{d(s)} f_{dis} + \frac{sTK_I}{d(s)} v_{FF} \quad (1)$$

$$d(s) = s^2T[Ms^2 + (C + K_aK_I)s + K] + \delta K_PK_I(1+sT) \quad (2)$$

x[m]: displacement (derived from the position sensor 4)
$r_o$[V]: reference value (reference voltage 14)
$f_{dis}$[N]: disturbance
$v_{FF}$[V]: supporting input
M[kg]: mass of vibration removing table 5 and placed device
C[Ns/m]: viscosity friction coefficient
K [N/m]: rigidity coefficient
$K_I$[Ns/V]: integration gain including the characteristics of the voltage-current amplifier 11 and the servo valve 2
$K_a$[Vs$^2$/m]: acceleration feedback gain of the filter 10
$K_p$[V/m]: gain of the displacement amplifier 12
T'[s]: a time constant of the PI compensator 15
$\delta$[V/V]: position gain
s: Laplace operator The area indicated by the broken line in FIG. 4 includes both characteristics of the servo valve 2 and a mechanism. A transfer function thereof is expressed below.

$$\frac{x}{V} = \frac{K_I}{s(Ms^2 + Cs + K)} \quad (3)$$

When an acceleration feedback is inputted, a transfer function from $V_c$ to displacement x is expressed as follows.

$$\frac{x}{V_c} = \frac{K_I}{s[Ms^2 + (C + K_IK_a)s + K]} \quad (4)$$

It is clear from this equation that the acceleration feedback gain $K_a$ has a function to stabilize the entire mechanism by increasing the viscosity term.

The reference $v_{FF}$ denotes a voltage to be impressed to a supporting input in order to remove or decrease the effect on the displacement x caused by the disturbance $f_{dis}$. Herein, the second term of the equation (1) can be canceled by the third term if a signal waveform of the supporting input $v_{FF}$ is adjusted.

The disturbance $f_{dis}$ is caused by a driven device placed on a vibration removing table. A waveform thereof is generally a bang-bang waveform as shown in FIG. 5. The waveform is caused by the placed device which is positioned after rapid speed adjustment is made. The bang-bang waveform can be expressed by a combination of step waveforms. Herein, suppose the disturbance $f_{dis}$ is a step waveform. Since a device placed on the vibration removing table 5 is driven by an actuator such as a DC servo-motor, an electric signal generated at the time of driving the actuator can be utilized as a signal corresponding to a disturbance $f_{dis}$ even when it is impossible to directly measure the disturbance $f_{dis}$. This electric signal can be also utilized as an input to the supporting input $v_{FF}$. However, the order of the polynomials in the numerators of the second and third terms of the equation (1) is 2 and 1 respectively. When a step-type disturbance $f_{dis}$ is inputted, impressing of the step-type voltage $v_{FF}$ would not remove the effects on the displacement x caused by including dynamics. Therefore, a signal inputted to the supporting input, $v_{FF}'=sv_{FF}$ is newly inputted to the third term of the equation (1). However, the use of a differentiator which amplifies high-frequency noise is not preferable. In practice, a low-pass filter having an appropriate time constant T is added as a pseudo-differentiator, and feedforward compensation is executed through the pseudo-differentiator. The resulting relationship of the equation (1) is expressed in the equation (5). Note that $k$ is the gain of the pseudo-differentiator.

$$x = \frac{\delta K_I(1+sT)}{d(s)} r_0 + \frac{s^2T}{d(s)} f_{dis} + \frac{sTK_I}{d(s)} \cdot \frac{ksT}{1+sT} v_{FF} \quad (5)$$

The idea of the above described feedforward compensation is to impress a signal $v_{FF}$ which cancels the effects of the disturbance $f_{dis}$.

The effects of the aforementioned feedforward compensation for suppressing vibrations of the vibration removing table will be described below. The disturbance $f_{dis}$ is a bang-bang waveform as illustrated in FIG. 5. Suppose that the bang-bang waveform is repeatedly and periodically impressed. A comparison made between the displacement x with the supporting input $v_{FF}$ as described in the third term of the equation (5) and the displacement x without any supporting input is illustrated in FIGS. 6A and 6B. FIG. 6A illustrates a case where the supporting input $v_{FF}$ is impressed (with a feedforward compensation) and FIG. 6B illustrates the case where $v_{FF}=0$ (without feedforward compensation). Obviously, the displacement x is more effectively suppressed in FIG. 6A compared with that of FIG. 6B. This experiment demonstrates the effectiveness of feeding a driving signal, which is to be sent to the device placed on the vibration removing table of the air-spring supporting leg, to the pseudo-differentiator, and impressing an output signal thereof to a preceding stage of the voltage-current converter 11 which drives a servo-valve. The experiment shown in FIG. 6 is a case where a setting of a closed-loop system, consisting of an air-spring supporting leg and a corresponding feedback apparatus, is excellent; more specifically, the period and the repetition of the disturbance $f_{dis}$ itself in the bang-bang waveform are relatively long compared to the natural period of the closed-loop system.

When a relationship of the above described natural period is reversed, for instance, when a subject supported by the vibration removing table 5 is large, the response of the air-spring vibration removing apparatus becomes slow. In other words, the natural period of the vibration removing table 5 becomes substantially long. On the other hand, motion patterns of a device placed on the vibration removing apparatus 5 becomes faster with a rapid short-period speed adjustment motion and its repeating period becomes shorter. A result of the experiment is shown in FIGS. 7 and 8 in which the above described feedforward compensation is executed by having a driving signal sent through a pseudo-differentiator for the vibration removing table 5. FIG. 7 shows the case without a feedforward compensation and FIG. 8 shows the case with the feedforward compensation. Although the vibration removing apparatus is completely different from the one utilized in FIG. 6, the control system is equivalent. In FIGS. 7 and 8, the waveforms A and A' indicate a displacement x, and waveforms B indicates a driving signal of a placed device. When the waveform A of the displacement x without a feedforward compensation is compared with the waveform A' with a feedforward compensation of a driving signal which has been pseudo-differentiated, a reduced amplitude of the displacement x is seen in a time domain of an initial positive edge of the driving signal B. However, within a time domain where the driving signal B has a negative polarity, an increased amplitude of the displacement x results when a feedforward compensation is applied thereto. The cause is apparent. It is because the response of the closed-loop in the air-spring vibration removing apparatus is substantially slower compared to the period of motion patterns of a device placed thereon, that is the period of positive-negative change of the bang-bang waveform shown in FIG. 5. An initial stage of an amplitude in the response waveform is suppressed by having a pulse signal, obtained by applying a pseudo-differentiator to a first positive edge of the bang-bang waveform, inputted to the voltage-current converter. However, since the suppressed waveform converges slowly, the negative edge of the waveform in a negative polarity of the bang-bang waveform and a positive edge of the following waveform are respectively inputted before the waveform converges to a steady state, resulting an increased response amplitude.

FIG. 9 is an example of numerical calculations that demonstrates the qualitative tendency of the above-described experiment. In FIG. 9, a solid line denotes a response without feedforward compensation, and a broken line denotes a response with feedforward compensation. In the case where the feedforward compensation is applied, the first peak value is suppressed to a low value compared with the case where a feedforward compensation is not applied, and a consecutive response waveform is extended, resulting a slowly converging waveform. Therefore, the numerical experiment proves that the result qualitatively coincides with the result of the experiment shown in FIGS. 7 and 8.

As set forth above, for an air-spring vibration removing apparatus having an air-spring as an actuator, an air-spring vibration removing apparatus has been suggested, wherein a signal obtained by pseudo-differentiating a speed-adjusting signal of a device placed on a vibration removing table is inputted as a feedforward compensation in a preceding stage of a voltage-current converter, which drives a servo-valve for adjusting air as an operation fluid of the air spring, in order to suppress vibrations caused by a positioning motion of a device placed on the apparatus. However, there is a drawback in that feedforward compensation for suppressing vibrations of the vibration removing table does not effectively function when the period of speed adjustment as well as a repeating period of the speed adjustment of the device placed on the air-spring vibration removing apparatus become substantially short, compared to the natural period of the air-spring vibration removing apparatus.

SUMMARY OF THE INVENTION

The present invention has been made in consideration of the above situation, and an object of the present invention is to provide a vibration removing apparatus and control method thereof which effectively removes vibrations even when the driving period of a device placed on the vibration removing apparatus is shorter than the natural period of the vibration removing apparatus.

It is another object of the present invention to enable an appropriate feedforward compensation and to generate a pulse having a desired peak value and a time-width as an alternate pulse of a differentiated pulse of a driving signal of a device placed on the vibration removing apparatus.

It is still another object of the present invention to predictably generate a driving signal of the device placed on the vibration removing apparatus before the driving signal is actually generated, and to effectively remove vibrations in a slow response control system by performing feedforward compensation based on the predictably generated driving signal.

In order to achieve the above objects, according to one of the examples of the vibration removing apparatus in the present invention, an air-spring vibration removing apparatus having a feedback apparatus comprises a pseudo-differentiator for pseudo-differentiating a speed-adjusting signal of a device placed on a vibration removing table and a pulse selector for selecting an arbitrary pulse from a series of pulsed output signals of the pseudo-differentiator. An output of the pulse selector is inputted as a feedforward compensation to a feedback apparatus of the vibration removing apparatus, or preferably in a preceding stage of a current-voltage converter which drives an air-spring.

Further, according to another structural example of the present invention, a square-type solitary wave, having a time-width and an amplitude which are adjustable by triggering at an arbitrary edge of a speed-adjusting signal of a device placed on a vibration removing apparatus, is generated, and the square-type solitary wave is feedforwarded to a preceding stage of the voltage-current converter, which drives an air-spring in a feedback apparatus. Alternatively, a predictor capable of changing the lead time and a pulse generating apparatus which generates a pulse wave, by triggering an output signal of the predictor, are embodied in the air-spring vibration removing apparatus. The predictor starts-up the pulse generator immediately before vibrations of the vibration removing table are actually generated, and an output signal of the pulse generator is feedforwarded to the feedback apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

Preferred embodiments of the present invention will now be described in detail in accordance with the accompanying drawings.

[First Embodiment]

Figure 1:
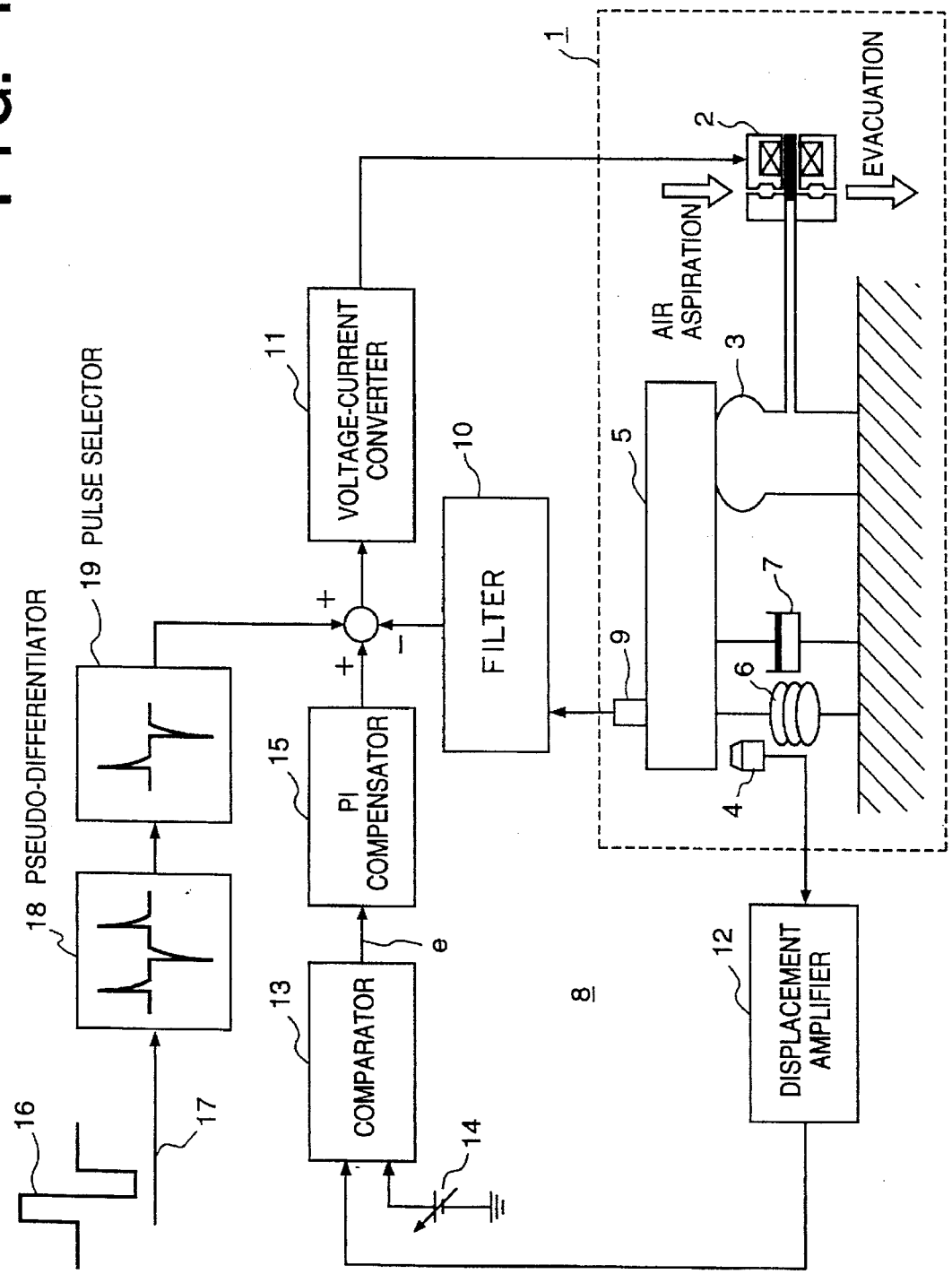
FIG. 1 is a block diagram showing the structure of an air-spring vibration removing apparatus according to the first embodiment of the present invention.
Figure 3:
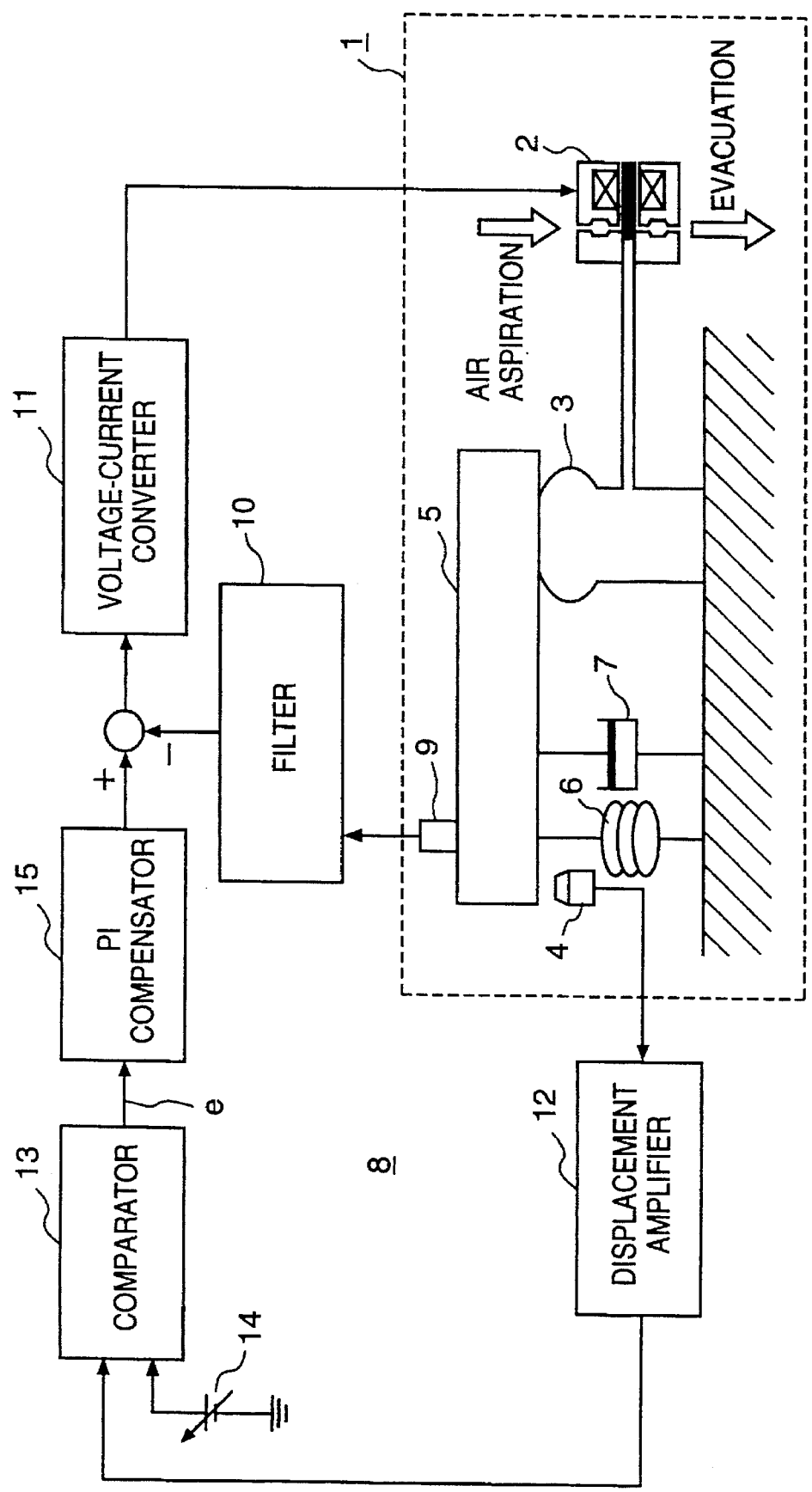
FIG. 3 is a block diagram showing the structure of a conventional air-spring vibration removing apparatus.
Figure 4:
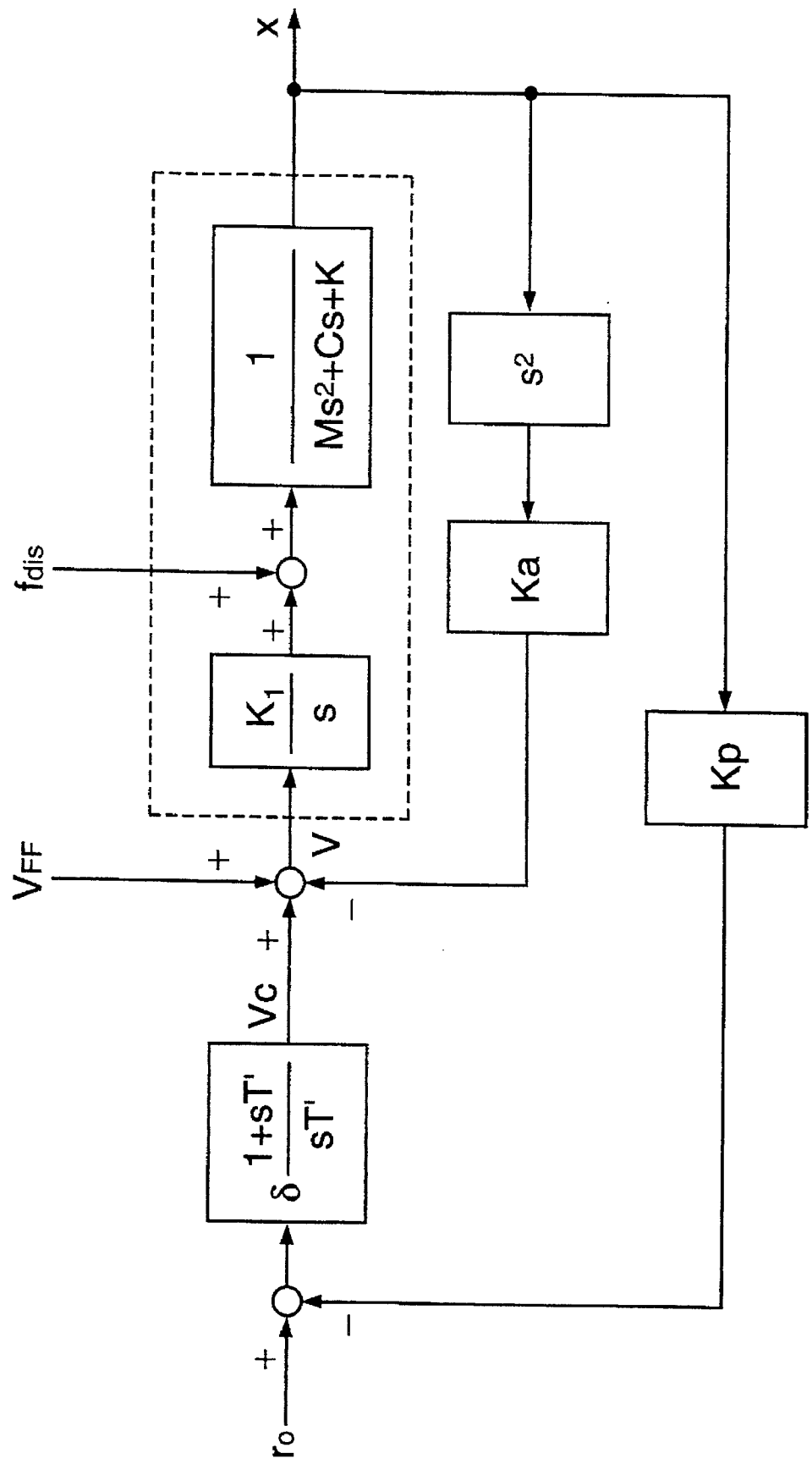
FIG. 4 is a servo-block diagram of an air-spring vibration removing apparatus.
Figure 5:
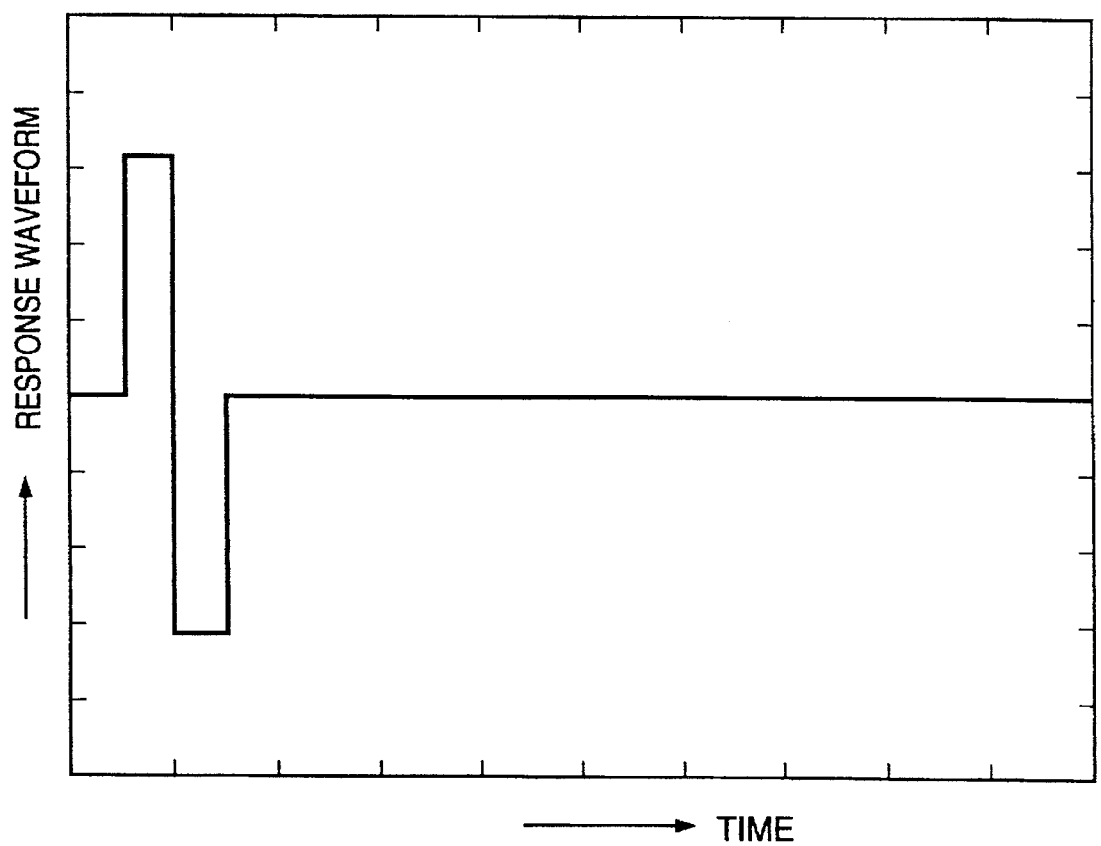
FIG. 5 is a graph showing a bang-bang waveform.
Figure 6A:
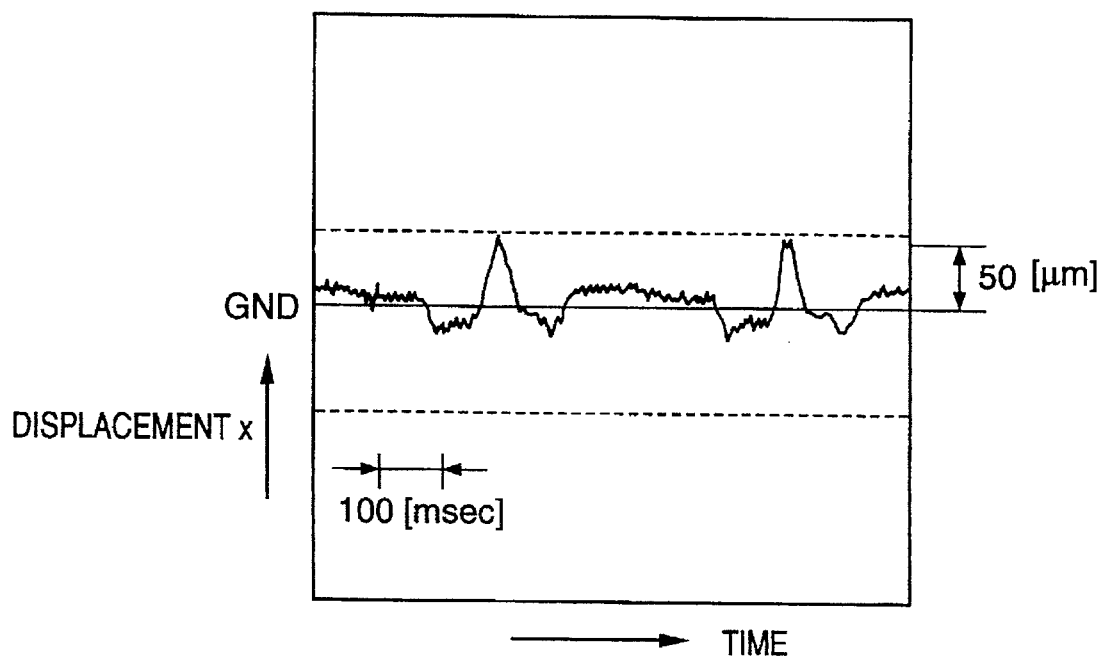
FIG. 6A and 6B are graphs showing the results of experiments which illustrate the effects of the conventional feedforward compensation.
Figure 6B:
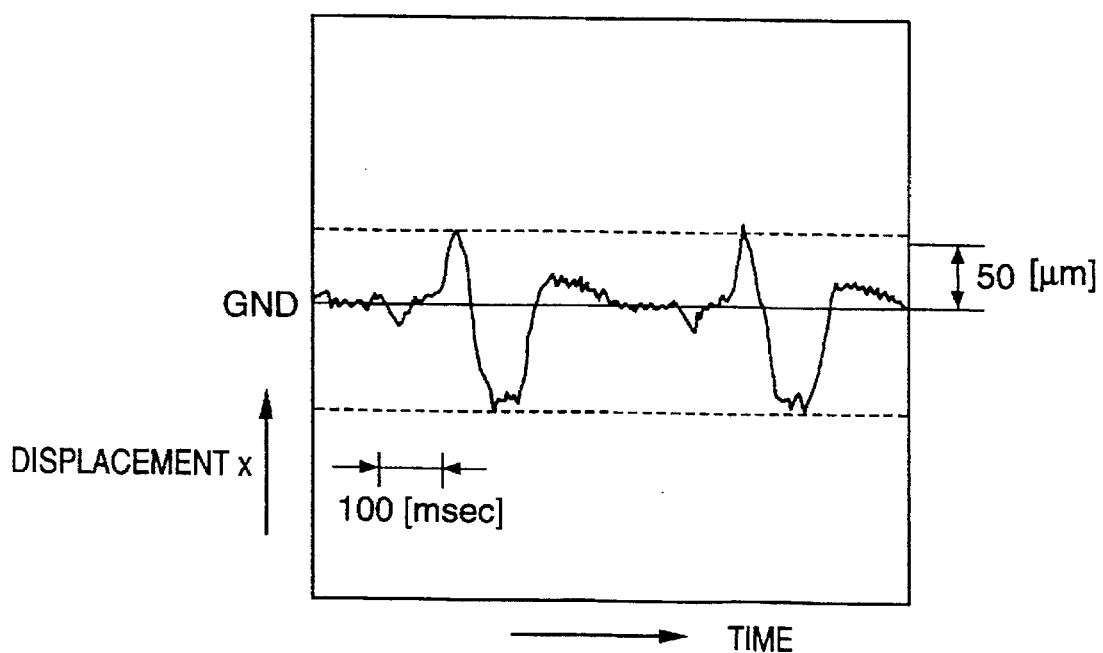
Figure 7:
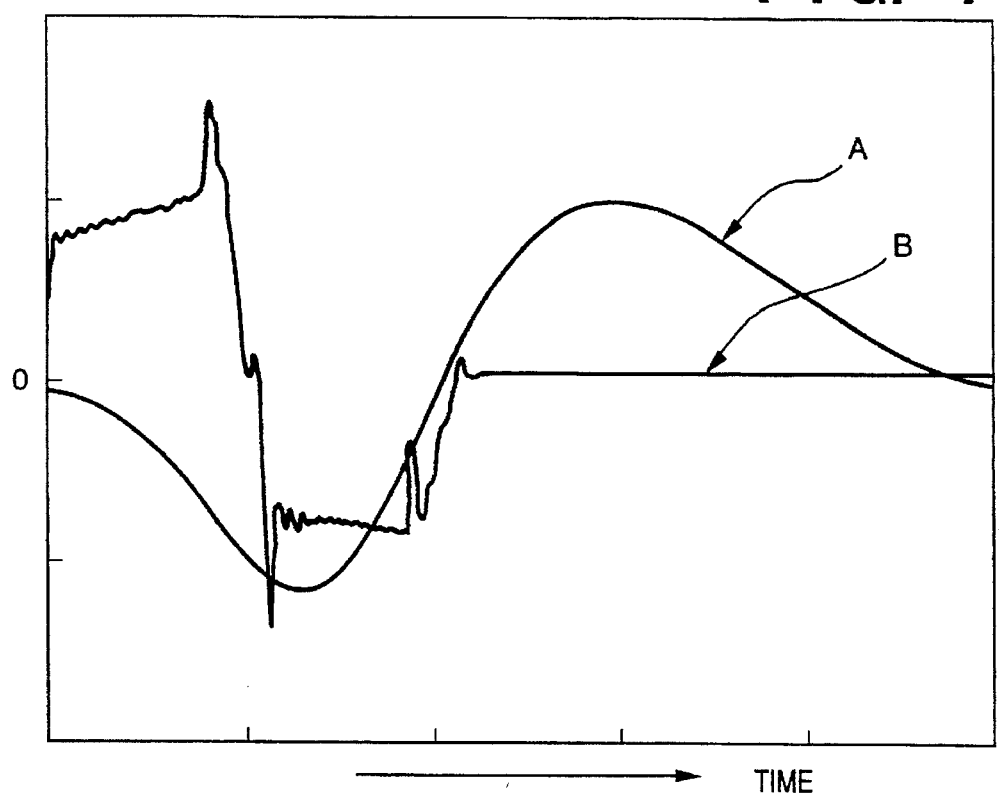
FIG. 7 is a graph showing a result of a second experiment executed without feedforward compensation.
Figure 8:
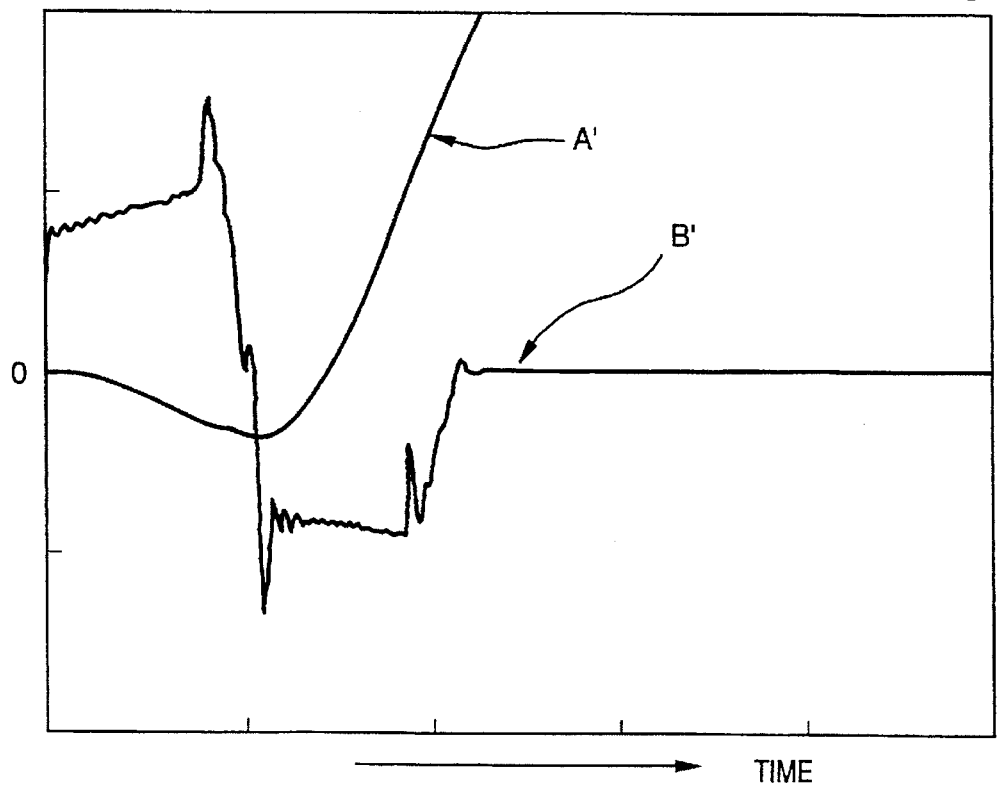
FIG. 8 is a graph showing a result of the second experiment executed with feedforward compensation.
Figure 9:
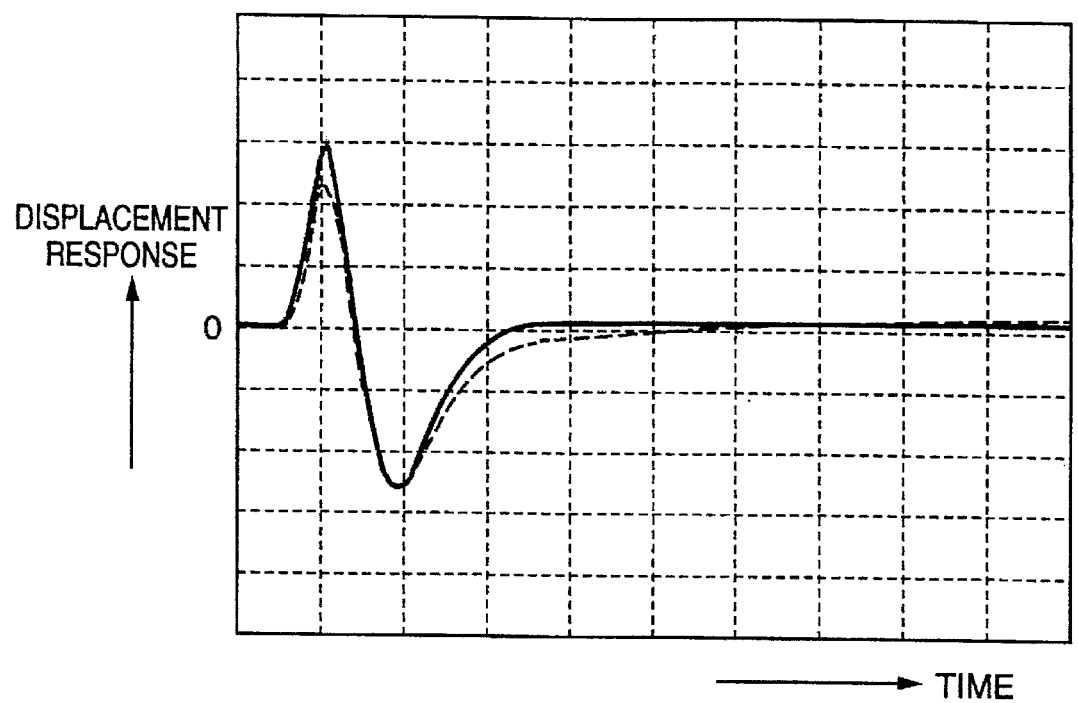
FIG. 9 is a graph showing a result of a numerical calculation which illustrates a qualitative tendency representing a result of an experiment in the conventional example.

FIG. 1 shows the structure of an air-spring vibration removing apparatus according to a first embodiment of the present invention. In FIG. 1, the same reference numerals are assigned for the components shown in FIG. 3. In FIG. 1, reference numeral 18 denotes a pseudo-differentiator for pseudo-differentiating a speed-adjusting signal 16 lead by a signal line 17 and reference numeral 19 denotes a pulse selector for selecting an arbitrary number of pulse waveforms from a series of pulse waveforms. Herein, the pulse selector 19 inputs a speed-adjusting signal lead by the signal line 17 (in this case, a bang-bang waveform) and selects the first two pulses to be outputted. Accordingly, in the block of the pulse selector 19 in FIG. 1, only the first two pulse waveforms among three pulse waveforms, which are outputs of the pseudo-differentiator 18, are shown. Note that such selections of pulse waveforms are determined in relation to a parameter utilized in the following numerical experiment and they are generally arbitrary. In other words, pulse waveforms to be selected are experimentally or logically determined from a series of pulse waveforms outputted from the pseudo-differentiator 18 based on the relationship of length of the period between a natural period of the vibration removing table 5 including the feedback apparatus 8 and a period of the speed-adjusting signal 16.

Figure 10:
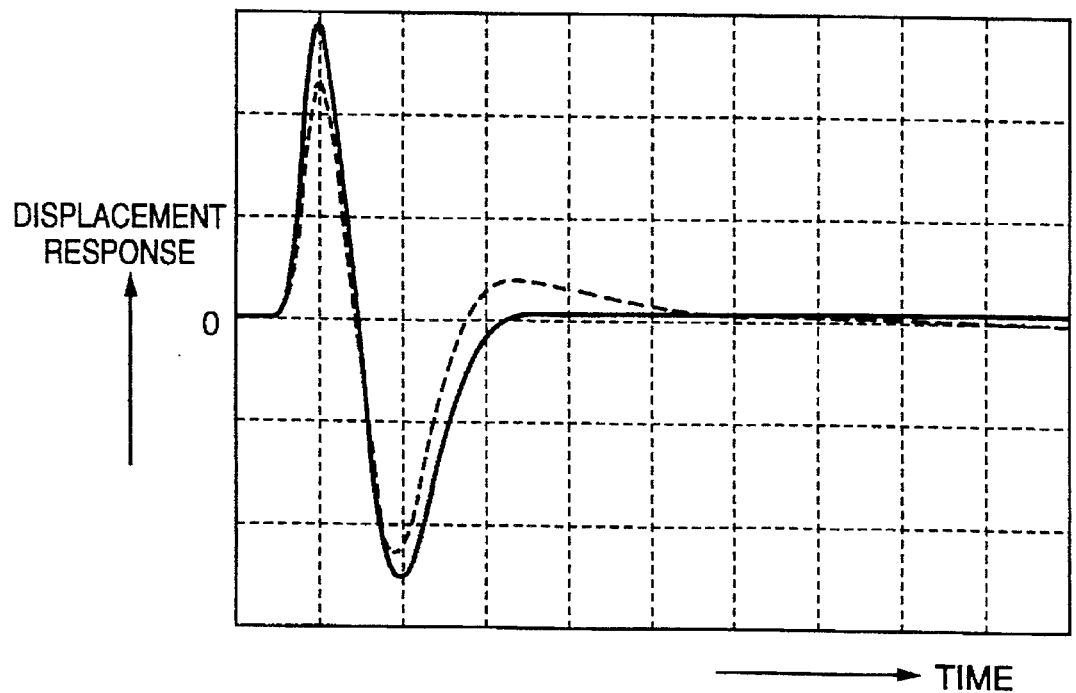
FIG. 10 is a graph showing a result of a numerical experiment which illustrates an effect of selected feedforward compensation according to the apparatus shown in FIG. 1.

FIG. 10 shows a response waveform in a case where the first two pulse waveforms among three waveforms, obtained by pseudo-differentiating the driving signal 16 of the bang-bang waveform, are selected, and are added to a preceding stage of the voltage-current converter 11 as a feedforward compensation. It shows that a maximum amplitude is suppressed and convergency towards displacement response zero is improved.

Figure 15:
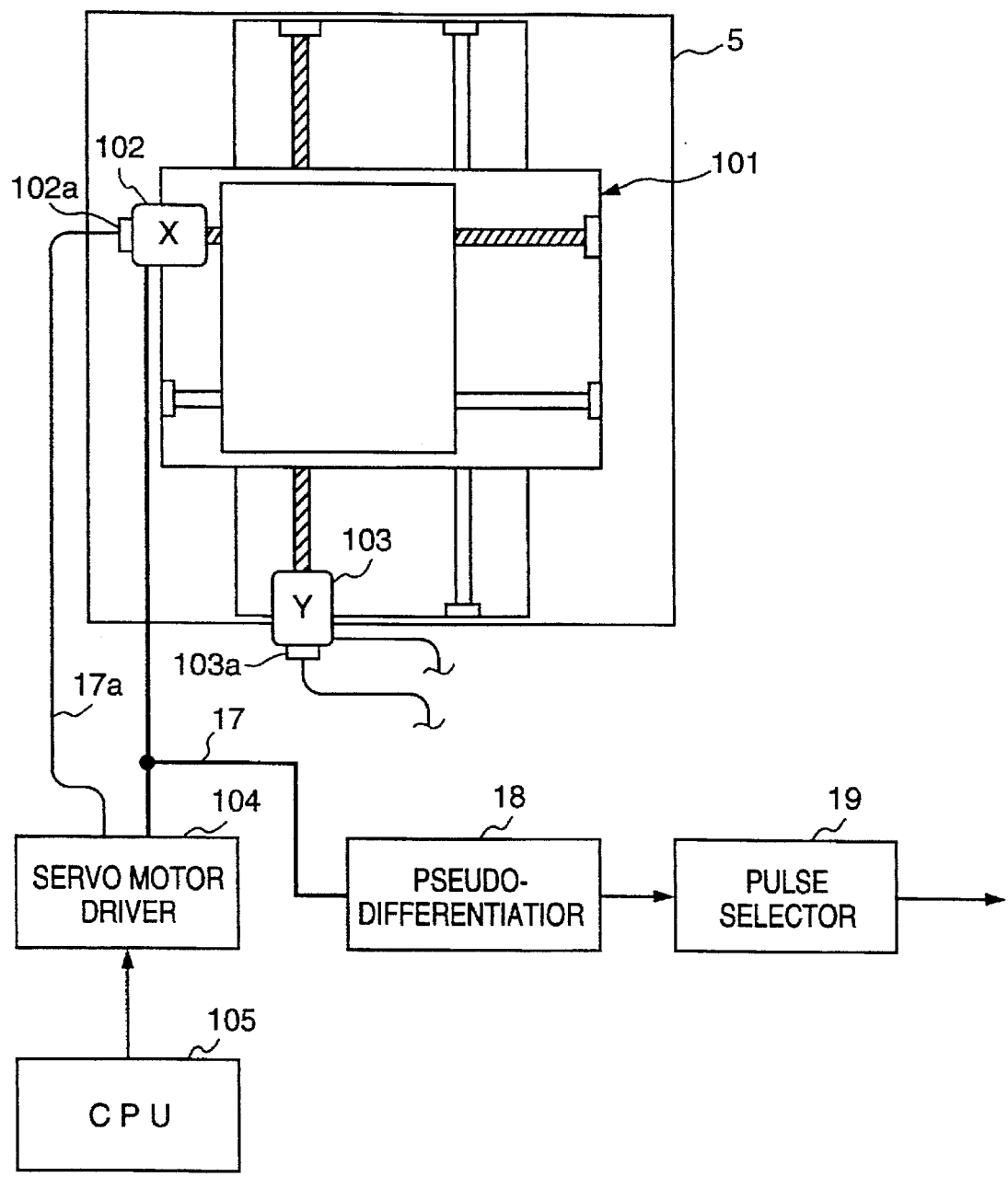
FIG. 15 is an explanatory view of an XY platform and a driving system thereof according to the first embodiment.

Next, an XY platform applying the above described air-spring vibration removing apparatus will be described. FIG. 15 shows an XY platform and a driving system thereof according to the first embodiment. In FIG. 15, reference numeral 101 denotes an XY platform; and 102 denotes an X-axis motor for moving the XY platform 101 to the X-axis direction. Similarly, a reference numeral 103 denotes a Y-axis motor for moving the XY platform 101 to the Y-axis direction. Reference numeral 102a denotes an encoder for detecting the driving quantity as well as the driving speed of the X-axis motor 102; 103a denotes an encoder for detecting the driving quantity as well the driving speed of the Y-axis motor 103; and 17a denotes a control signal line which transmits a control signal from the encoder 102a.

A reference numeral 104 denotes a servo motor driver for the X-axis motor 102 and controls driving of the X-axis motor 102 in accordance with a moving quantity and a moving speed instructed by a CPU 105 while obtaining the driving quantity and the driving speed from the encoder 102a as a feedback signal. Note that a similar control system applies to the Y-axis motor 103, but drawings thereof will not be shown.

In the pseudo-differentiator 18, a signal for driving the X-axis motor 102 is inputted from the servo motor driver 104 via the signal line 17. As described above, the pseudo-differentiator 18 generates a pseudo-differentiation pulse of a driving signal inputted via the signal line 17 and inputs the pulse to the pulse selector 19. Then the pulse selector 19 selects the first two pulse, as an output, among three differentiated pulses obtained by differentiating a bang-bang waveform.

The differentiated pulse, outputted from the pulse selector 19 as set forth above, is inputted to the feedback apparatus 8 in FIG. 1 as a feedforward signal of the vibration removing apparatus. Note that the above explanation relates to removing vibrations in the X-axis direction; and removing vibrations in the Y-axis direction can be achieved by having providing the same structure as the X-axis.

Input and output signal waveforms of the above described pseudo-differentiator 18 and the pulse selector 19 will be described next with reference to FIGS. 16A–16D.

Figure 16A:
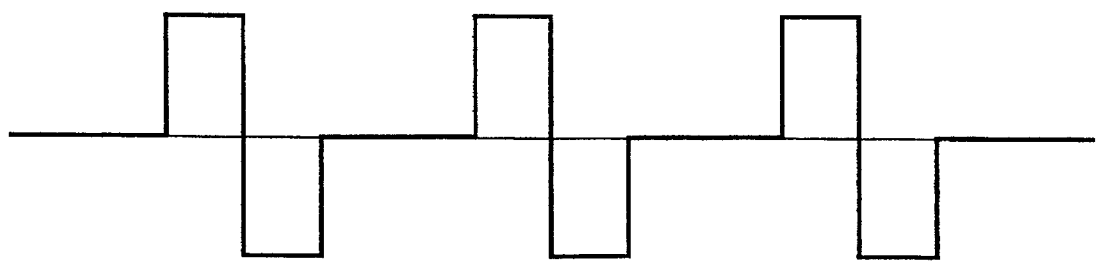
FIGS. 16A, 16B and 16C are timing charts showing the timings of inputted signal waveforms and outputted signal waveforms to or from a pseudo-differentiator or a pulse selector.
Figure 16B:
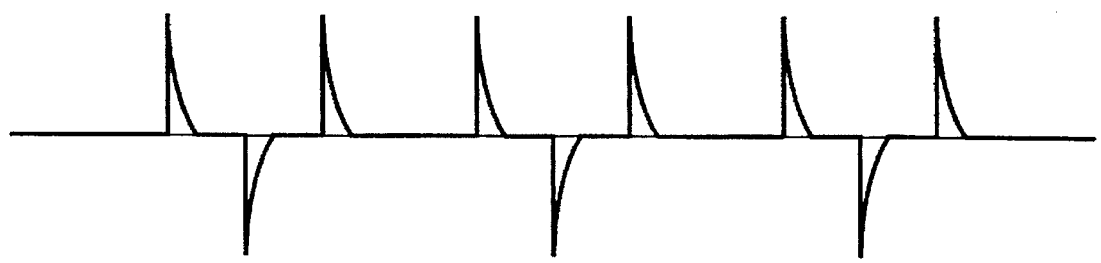
Figure 16C:
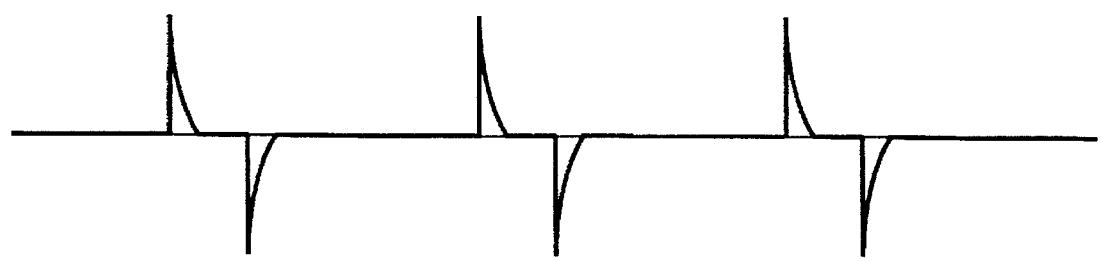

FIG. 16A shows a driving signal to be inputted to the pseudo-differentiator 18. In this example, a bang-bang waveform is inputted as a driving signal. Three bang-bang waveforms are inputted in FIG. 16A. FIG. 16B shows an output signal waveform 6f the pseudo-differentiator 18 when the bang-bang waveform shown in FIG. 16A is inputted. The pseudo-differentiator 18 generates the differentiated pulse for each edge of the inputted bang-bang waveform and output them to the pulse selector 19. FIG. 16C shows an output signal waveform from the pulse selector 19. The first two differentiated pulses obtained from the bang-bang waveform are outputted.

An example of the structure for selecting differentiated pulse as set forth above will be described below.

Figure 16D:
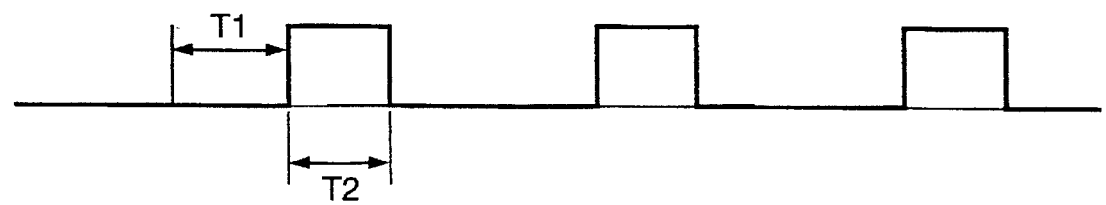
FIG. 16D is an explanatory view of a mask period of the pulse selector according to the first embodiment.

The differentiated pulse output as described in FIG. 16C can be obtained when the pulse selector 19 masks an output of the differentiated pulse with the timing shown in FIG. 16D. Herein, the timing for the masking is a period T2 which occurs after an elapse of T1 since the first pulse input of the bang-bang waveform.

Figure 17:
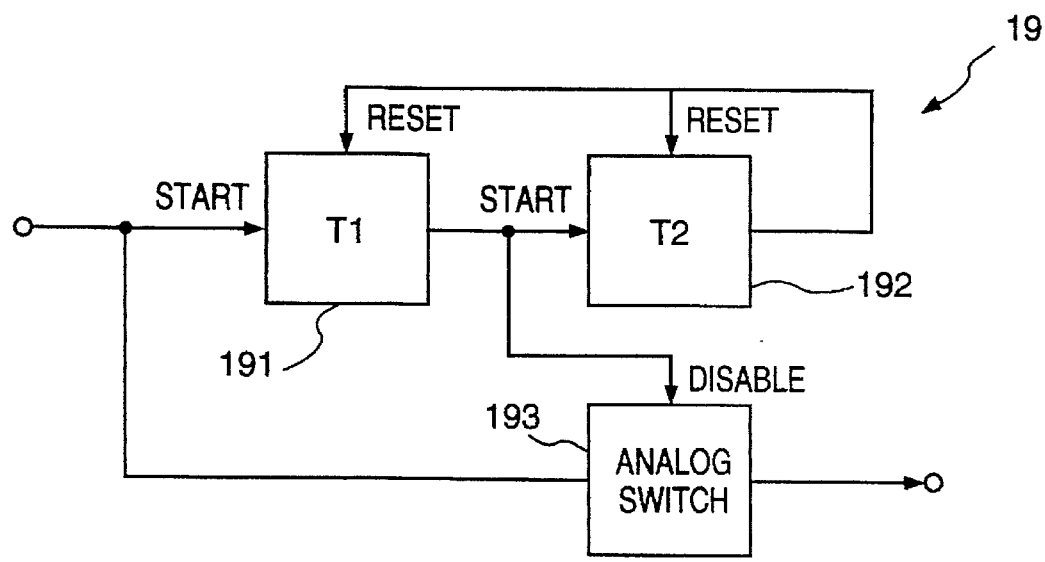
FIG. 17 is a block diagram showing the structure of the pulse selector according to the first embodiment.

FIG. 17 is a block diagram illustrating an example of a structure of the pulse selector 19. In FIG. 17, reference numerals 191 and 192 denote a timer. The timer 191 starts time measurement when a pulsed starting signal is inputted and outputs a time-up signal when the period T1 elapses. The timer 192 starts time measurement when the time-up signal of the timer 191 is inputted and outputs a time-up signal when the period T2 elapses. A reference numeral 193 denotes an analog switch structured by i.e., a diode gate. The analog switch 193 shuts out inputs and outputs during the time the time-up signal of a timer 1 is inputted from a "Disable" terminal.

With the foregoing structure, when an initial differentiated pulse obtained from the bang-bang waveform is inputted, the timer 191 is started. At this point, since the analog switch 193 is in a conductive state, an inputted differentiated pulse is outputted without being processed. If the next differentiated pulse is inputted within the period T1 from the input of the initial differentiated pulse, the subject differentiated pulse is outputted via the analog switch 193.

When the period T1 elapses, a time-up signal is outputted from the timer 191. The time-up signal is inputted to the timer 192 as a starting signal, then the timer 192 is started. At the same time, the time-up signal of the timer 191 is inputted to the analog switch 193 as a "disable" signal and the analog switch 193 is switched to a shut-out state. Therefore, a third differentiated pulse inputted to the pulse selector 19 is not outputted.

Next, when the period T2 elapses, a time-up signal is outputted from the timer 192. The time-up signal is inputted to the timer 191 and the timer 192 as a reset signal, and the pulse selector 19 goes back to an initial state. In other words, the time-up signals of the timer 191 and the timer 192 are reset and the analog switch 193 assumes a conductive state.

Note in the foregoing circuit structure, various differentiated pulse can be selected if the time set as the periods T1 and T2 are changed for the timers 191 and 192.

[Second Embodiment]

In the first embodiment as shown in FIG. 1, the first two pulse waveforms among three pulse waveforms, obtained by pseudo-differentiating a bang-bang waveform, are selected. The selection is made experimentally or logically considering the relationship of length of the period between a natural period of the vibration removing table and the period of the bang-bang waveform. Then, the effect illustrated in FIG. 10 was obtained by adding the selected series of waveforms to a preceding stage of the voltage-current converter 11 in the feedback apparatus 8.

Figure 11:
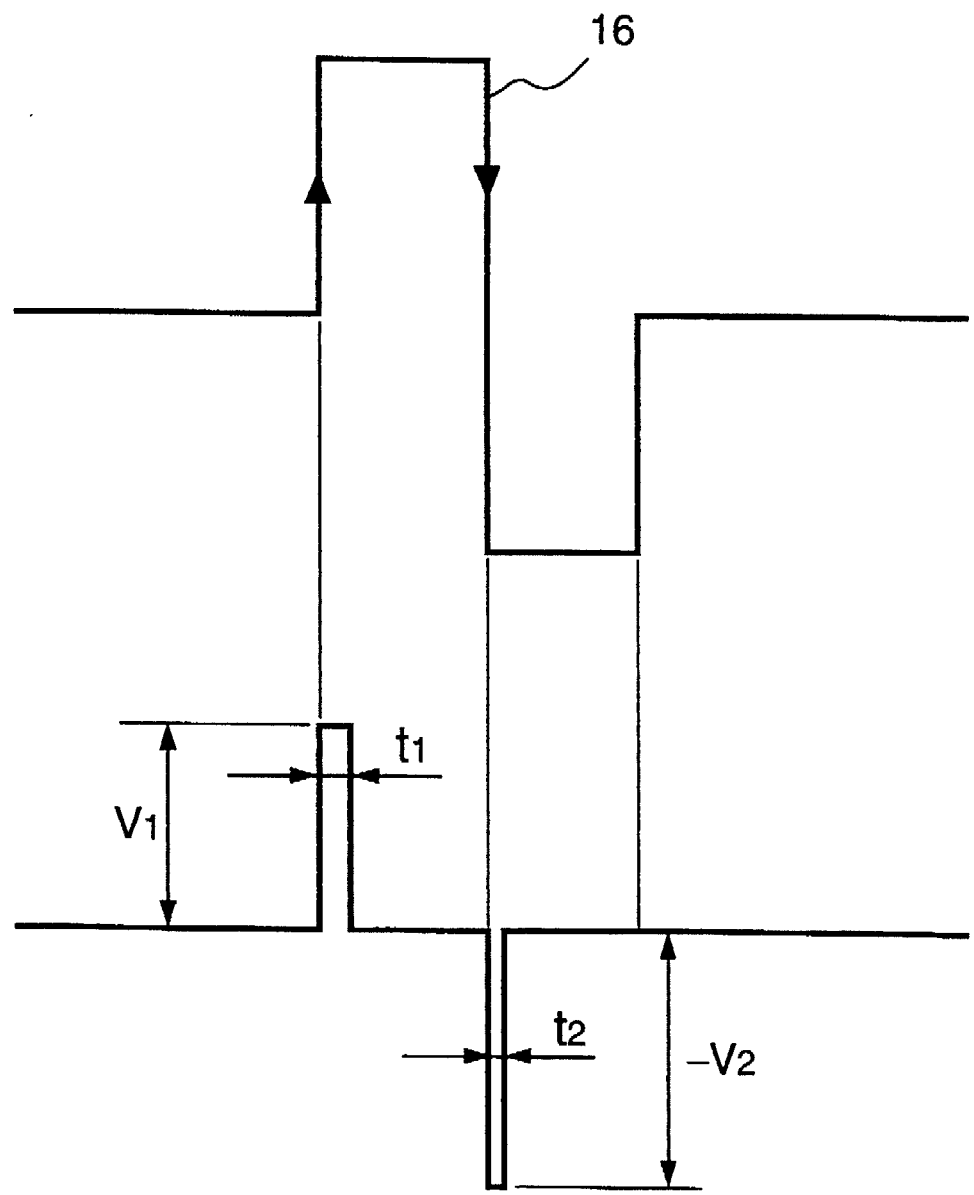
FIG. 11 shows a square-type solitary wave in the second embodiment of the present invention.

A similar effect can be obtained without utilizing the series of pulse waveforms obtained by pseudo-differentiating a bang-bang waveform. FIG. 11 shows a pulsed waveform utilized for a feedforward compensation in the second embodiment. In the second embodiment, pulse generator is utilized instead of the pseudo-differentiator 18 and the pulse waveform selector 19, which generates a square-type solitary wave shown in FIG. 11, by triggering at an initial positive edge and an initial negative edge of the speed adjusting signal 16. That is, a series of square-type solitary waves outputted from the pulse generator is used as feedforward compensation signals. A square-type solitary wave can be easily generated, for instance by utilizing a single-shot multivibrator.

Figure 18:
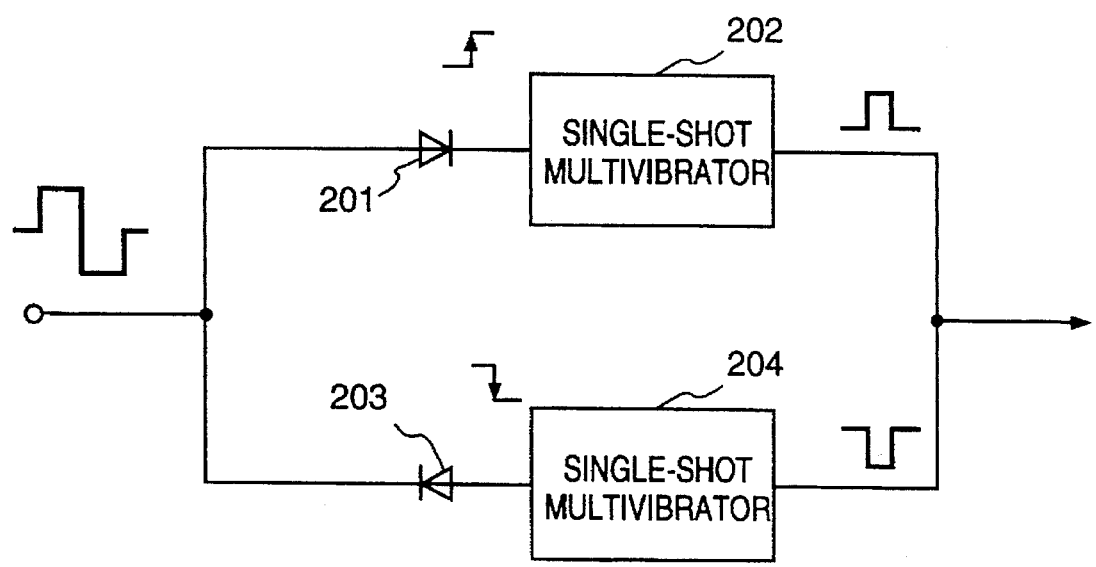
FIG. 18 is a block diagram showing the structure of a pulse generator according to the second embodiment.

FIG. 18 is a block diagram showing an example of the structure of a pulse generator in the second embodiment. Reference numerals 202 and 204 denote single-shot multivibrators. The single-shot multivibrator 202 generates square pulse having a time width $t_1$ and a peak value $V_1$ at a positive edge of an inputted signal. The single-shot multivibrator 204 generates square pulse having a time width $t_2$ and a peak value $V_2$ using the negative edge of an inputted signal. A diode 201 transmits a positive pulse of a bang-bang waveform and supplies the signal to the single-shot multivibrator 202; consequently the single-shot multivibrator 202 generates a square pulse corresponding to an initial positive edge of the bang-bang waveform. The diode 201 transmits a negative pulse of the bang-bang waveform and supplies the signal to the single-shot multivibrator 204; consequently, the single-shot multivibrator 204 generates a square pulse corresponding to an initial negative edge of the bang-bang waveform. By the pulse generator as set forth above, a square-type solitary wave having a time width $t_1$ and a peak value $V_1$ is generated by triggering at an initial edge of the speed-adjusting signal 16; also a square-type solitary wave having a time width $t_2$ and a peak value $-V_2$ is generated by triggering at a second negative edge of the speed-adjusting signal 16. It should be structured as such that the time widths $t_1$ and $t_2$ as well as the peak value $V_1$ and $V_2$ are variable. This can be easily achieved by changing, for instance, the time constant of the single-shot multivibrator. Then a series of the square-type solitary wave are added to a preceding stage of the voltage-current converter 11 in the feedback apparatus 8.

Figure 12:
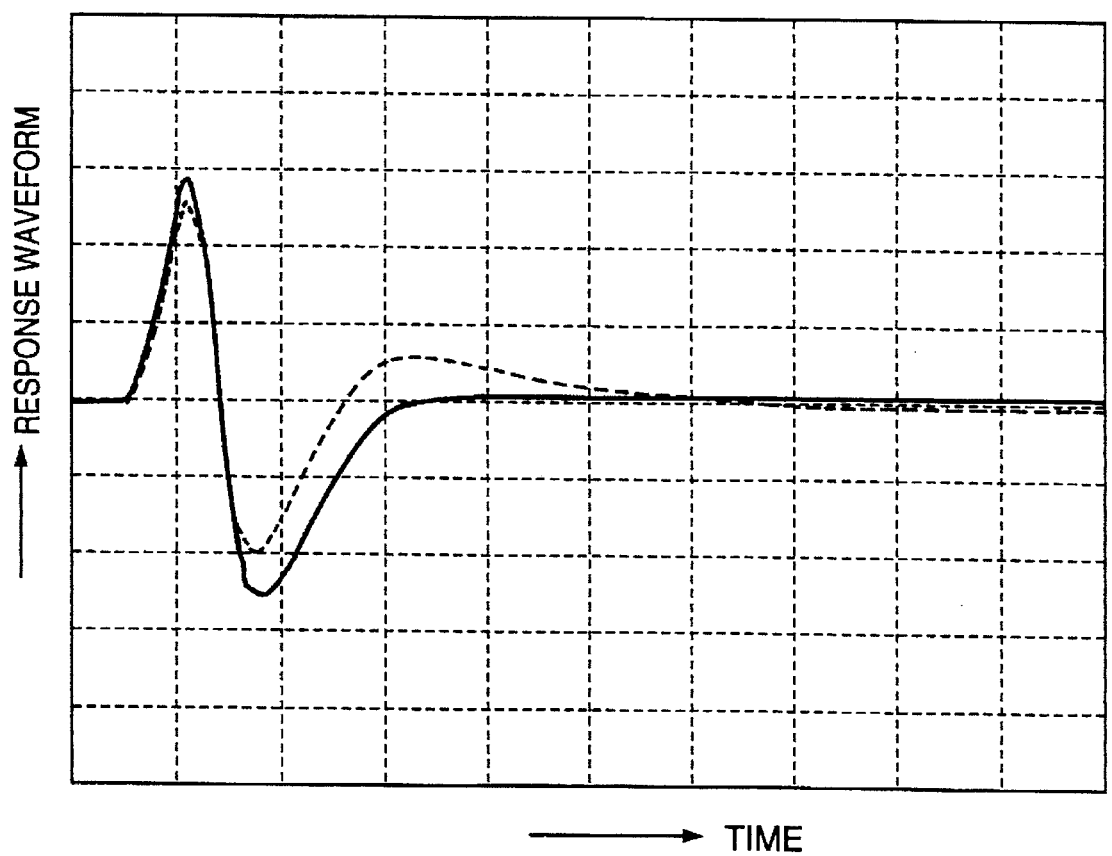
FIG. 12 is a graph showing a result of a numerical experiment illustrating an effect of a feedforward compensation of the square-type solitary wave in the second embodiment of the present invention.

FIG. 12 shows the result of a numeral experiment illustrating the effect of feedforward compensation in the above-described structure. In FIG. 12, a solid line denotes a displacement response without feedforward compensation and a broken line denotes a displacement response with feedforward compensation achieved by the above mentioned structure. The maximum amplitude is suppressed and convergency towards zero has been improved. In the relationship of the period of an air-spring vibration removing apparatus utilized for the calculation and a period of a disturbance $f_{dis}$ of the bang-bang waveform added thereto, a pulsed square wave was generated so that $t_1 < t_2$ and $V_1 < V_2$ are satisfied; and when feedforward compensation is applied thereto, the displacement response was suppressed. The $t_1$, $t_2$, $V_1$ and $V_2$ are variable and it is possible to generate a square-type solitary wave at a last positive edge of a bang-bang waveform; therefore, this can be applied to something other than the periodical relationship of the vibration removing table and the disturbance $f_{dis}$ utilized in FIG. 12.

[Third Embodiment]

As a response in a closed-loop system consisting of the feedback apparatus 8 becomes slow, it is natural that a response of a vibration removing table becomes slow when an electric signal is inputted thereto. In other words, in a case where the period of the speed-adjusting signal 16 is shorter than the natural period of the system closed by the feedback apparatus 8, even if some kinds of compensation are applied to the speed-adjusting signal 16 and added to a preceding stage of the voltage-current converter 11, it is natural that a response to the signal becomes quite slow.

Herein, notice the fact that a speed-adjusting motion pattern of a device, placed on the vibration removing apparatus 5, is generally already known. For instance, suppose that an XY platform for exposure is placed on the vibration removing apparatus 5 and a step & repeat intermittent operation is performed. The motion pattern of the XY platform for exposure can be considered as a known fact where positioning characteristics are fairly stable. Alternatively, if the positions of the XY platform is monitored during the driving of the XY platform the timing of the actual jolting of the vibration removing table 5 can be predicted. Therefore, by precedingly applying feedforward compensation to the air-spring vibration removing apparatus for suppressing jolting before the vibration removing table 5 is actually jolted, the slow response can be compensated for.

Figure 2:
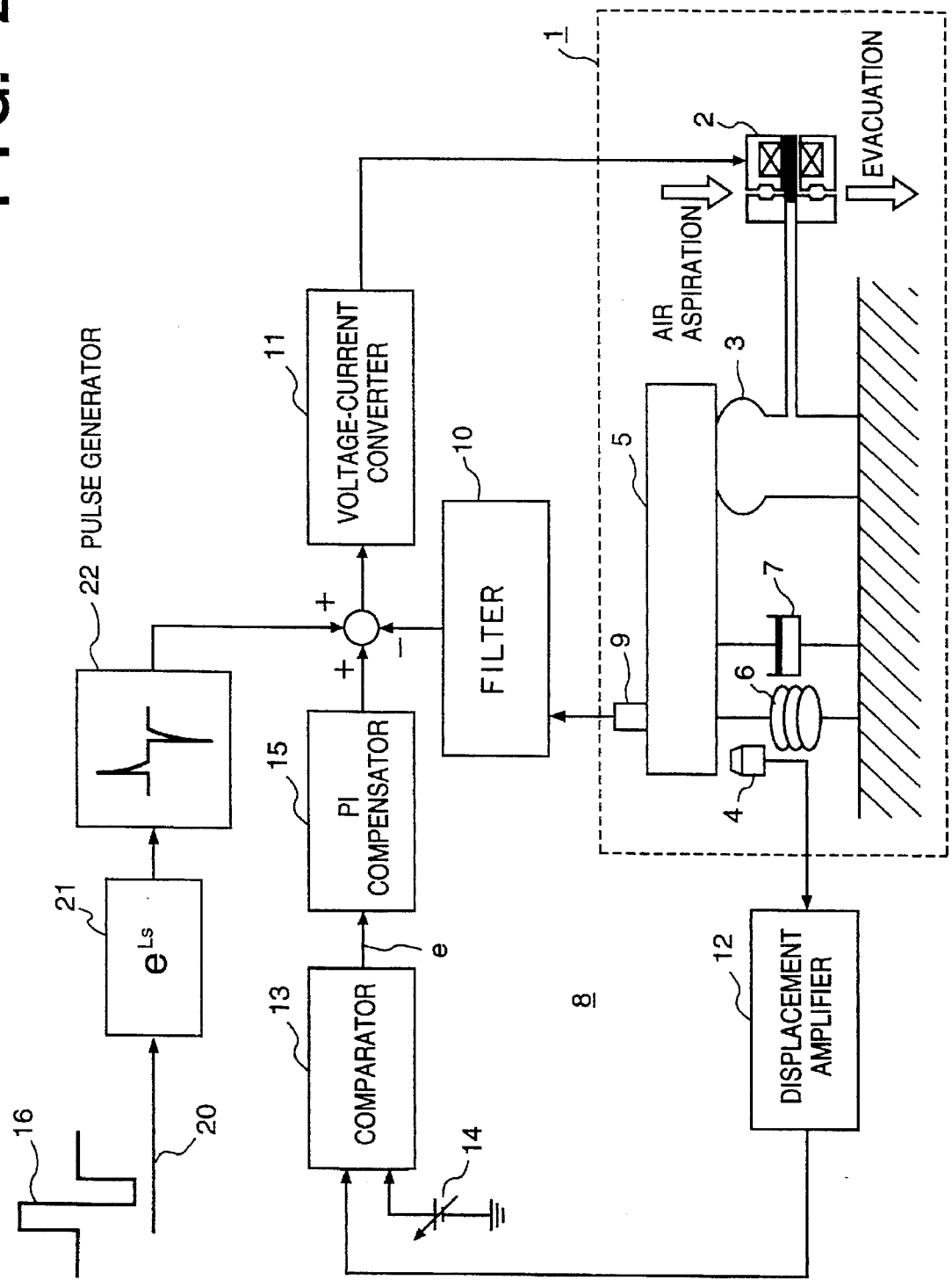
FIG. 2 is a block diagram showing the structure of an air-spring vibration removing apparatus according to the third embodiment of the present invention.
Figure 13:
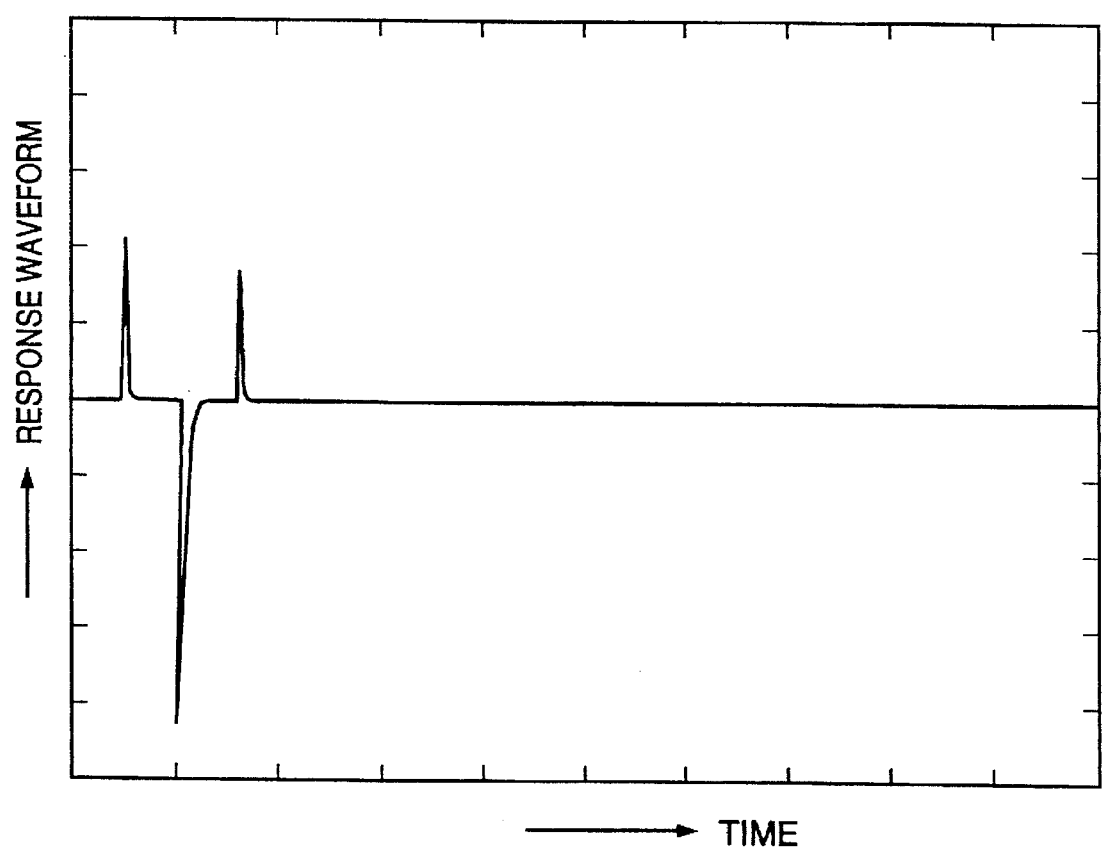
FIG. 13 is a graph showing a pseudo-differentiation of a bang-bang waveform.

The structure of the air-spring vibration removing apparatus according to the third embodiment of the present invention is shown in FIG. 2. A reference numeral 20 denotes a signal line; 21 denotes a predictor of which leading time L is variable; and 22 denotes a pulse generator. A signal prior to a speed-adjusting signal 16 actually being generated is fed to the signal line 20 and the predictor 21 is started. A reference $e^{Ls}$ written in a block of the predictor 21 in FIG. 2 denotes a lead time element. The pulse generator 22 generates a series of a pulse waveform shown in FIG. 13 or a series of a square-type solitary wave shown in FIG. 11, triggered by an output signal of the predictor 21. The output signal of the pulse generator 22 is added to a preceding stage of the voltage current converter 11, and vibrations of the vibration removing table 5 are suppressed.

As described above, in the third embodiment, a signal corresponding to a speed-adjusting signal is outputted from the predictor 21 prior to a speed-adjusting signal being actually generated. The pulse generator 22 generates a pulse based on the predictably outputted speed-adjusting signal to be outputted. Herein, in a case where the pulse generator 22 generates a series of a pulse wave shown in FIG. 13, the pulse generator 22 is structured with the pseudo-differentiator 18 described in the first embodiment. In a case where the pulse generator 22 generates a square-type pulse shown in FIG. 11, it is structured with the pulse generator shown in FIG. 18 described in the second embodiment. Further, if the pulse generator 22 outputs an arbitrary selected pulse, it is structured with pseudo-differentiator 18 and the pulse selector 19 in the first embodiment. In the case of the pulse generator 22 in FIG. 3, two initial pulses are selected and outputted as described in the first embodiment. With this structure, suppression of response amplitude is improved.

In the third embodiment, signals from an encoder 102a and 103a in FIG. 15, or a control signal from the CPU 105 are inputted to the predictor 21, to predict pulse generations based on the signal, and a bang-bang waveform is outputted to the pulse generator 22.

Figure 19:
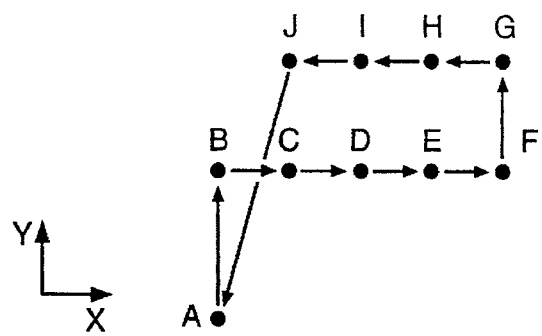
FIG. 19 shows an operational sequence of the XY platform according to the third embodiment.

FIG. 19 shows an example of a motion of the XY platform in the third embodiment. In this example, motion of the predictor 21 is described in a case where the XY platform 101 is moved in a predetermined timing along a position course of A, B, C . . . I, J and A as shown in FIG. 19.

Figure 20:
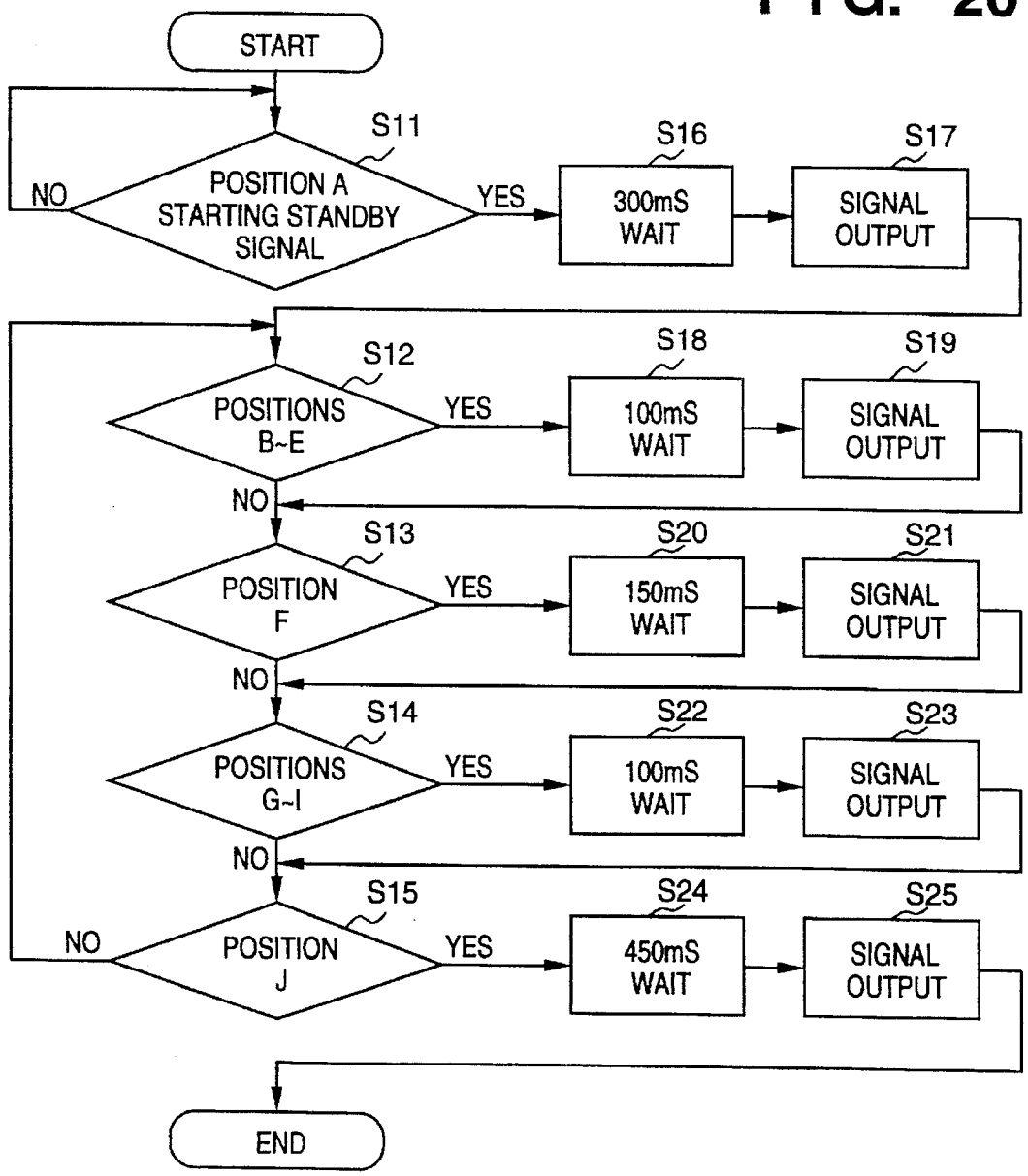
FIG. 20 is a flowchart describing an operational sequence of a predictor according to the third embodiment.

FIG. 20 is a flowchart describing the motion of the predictor 21 which predictably generates driving signals corresponding to the motion of the XY platform 101. Note that the predictor 21 comprises a CPU and a memory, and a program for executing the procedure described in the following flowchart is to be already installed in the memory.

When a current position A of the XY platform 101 is detected by a signal from the encoder and Generation of a start-up standby signal of the XY platform is detected, the procedure moves on to step S16. After waiting for a predetermined period of time (e.g. 300 ms), a driving signal waveform, which is predicted to be generated when the XY platform moves from the position A to B, is outputted. Herein, the start-up standby signal is outputted from the CPU 105 a predetermined period of time before an actual start-up of the XY platform 101.

Hereinafter, every time the arrival of position B . . . J is detected, the XY platform waits for a predetermined period of time and a predicted driving signal waveform is outputted (steps S12–S15 and S18–S25). Note that since a moving distance from the position B to the position C and a moving distance from the position F to the position G are different in this example, different driving signals are outputted at step S19 and step S21. Further, the waiting time illustrated in steps S16, S18, S20, S22 and S24 is variable; therefore, the leading time L is adjustable.

Figure 14:
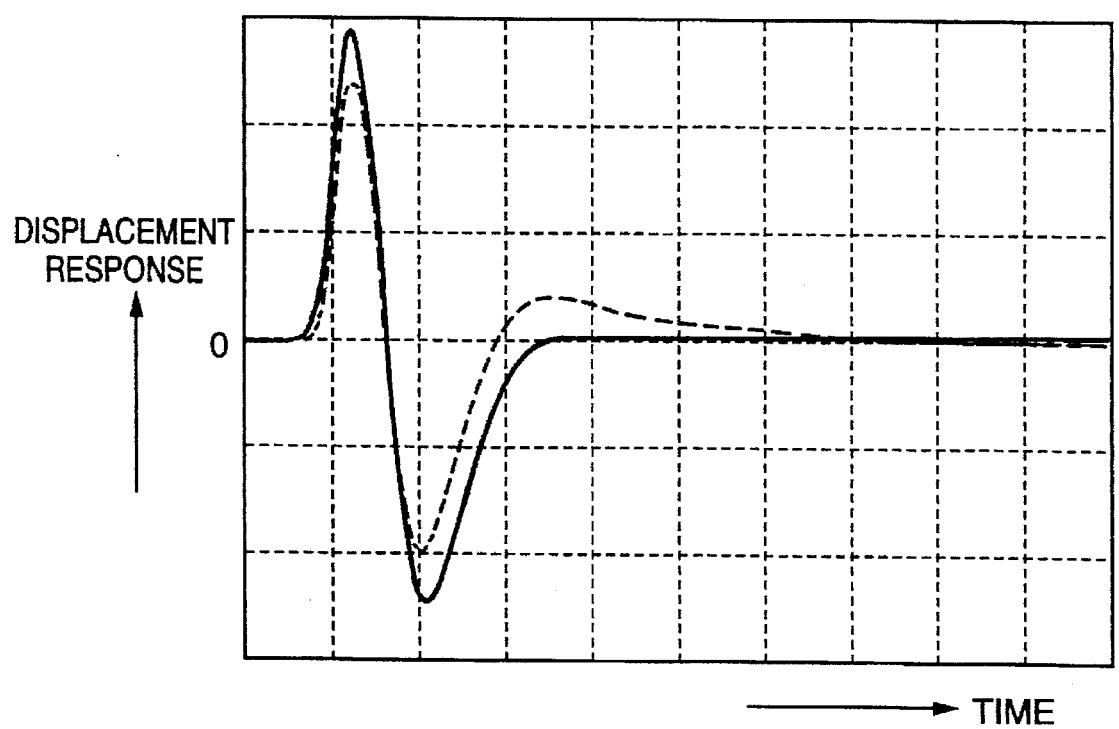
FIG. 14 is a graph showing a result of a numerical experiment illustrating an effect of a pre-feedforward compensation according to the apparatus shown in FIG. 2.

Feedforward compensation according to the above-described concept is called a pre-feedforward compensation. FIG. 14 shows the result of a numerical experiment illustrating the effect thereof. The broken line denotes a response waveform with pre-feedforward compensation and the solid line denotes a response waveform without a pre-feedforward compensation. Similar to FIGS. 10 and 12, the maximum response amplitude is suppressed and convergency toward a displacement response zero is improved.

As set forth above, the present invention enables effective suppression of vibrations of a vibration removing table by selecting a number of pulse waveforms obtained by pseudo-differentiating a speed-adjusting driving signal of a placed device, and adding the selected pulse waveforms to a feedback apparatus of an air-spring vibration removing apparatus having an air-spring as an actuator. Further vibrations of a vibration removing table can be suppressed by a square-type pulse signal substantially equivalent to the pseudo-differentiation signal generated by triggering an edge of a speed-adjusting signal, and adding the square-type pulse signal to the feedback apparatus. Still further, vibrations of a vibration removing table can be suppressed by applying a pre-feedforward compensation, utilizing the characteristics of the predictability in a generation of the speed-adjusting signal as well as the slow response of the vibration removing table.

Accordingly, an advantage can be obtained that the feedforward compensation for suppressing the vibrations of a vibration removing table is adjustable in order to comply with a case where the driving performance of a device, placed on an air-spring vibration removing apparatus having a long natural period, becomes faster. As a result, unnecessary enhancement of vibrations of the device placed on the vibration removing table is avoided; therefore, the best performance can be expected from the device.

As many apparently widely different embodiments of the present invention can be made without departing from the spirit and scope thereof, it is to be understood that the invention is not limited to the specific embodiments thereof except as defined in the claims.

What is claimed is:

1. A vibration removing apparatus which utilizes an air-spring comprising:
   control means for controlling the air-spring with a feedback control system utilizing a signal based on a displacement of a vibration removing table;
   producing means for producing a pulse signal corresponding to a selected edge of a driving signal of a device placed on said vibration removing table; and
   input means for inputting the pulse signal produced by said producing means as a feedforward signal in said feedback control system.

2. The vibration removing apparatus according to claim 1, wherein said producing means comprising:
   generation means for generating a series of differentiated pulses of said driving signal, and
   selecting means for selecting one or more of the differentiated pulses from the series of differentiated pulses generated by said generation means, to be outputted as a pulse signal.

3. The vibration removing apparatus according to claim 2, wherein said selecting means changes a series of differentiated pulses which has been selected from said series of differentiated pulses, in accordance with characteristics of a device placed on said vibration removing table.

4. The vibration removing apparatus according to claim 1, wherein said feedback control system comprises a converter for converting an operation signal to electric power required for driving the air-spring, and wherein said input means adds the pulse signal, produced by said producing means, to a preceding stage of said converter.

5. The vibration removing apparatus according to claim 1, wherein said producing means produces pulse signals when triggered by a selected edge of said driving signal.

6. The vibration removing apparatus according to claim 5, wherein said producing means comprises setting means for setting a time width and/or a peak value of pulse signals to be produced.

7. The vibration removing apparatus according to claim 6, wherein said setting means sets a time width and/or a peak value for each of the pulse to be produced by said producing means.

8. The vibration removing apparatus according to claim 5, wherein said feedback control system comprises a converter for converting an operation signal to electric power required for driving the air-spring, and wherein said input means adds the pulse signal, produced by said producing means, to a preceding stage of said converter.

9. A vibration removing apparatus which utilizes an air-spring, comprising:

control means for controlling the air-spring with a feedback control system utilizing a signal based on a displacement of a vibration removing table;

generation means for generating a prediction signal corresponding to a driving signal of a device placed on said vibration removing table prior to generation of said driving signal;

producing means for producing a pulse signal based on said prediction signal; and input means for inputting the pulse signal produced by said producing means as a feedforward signal in said feedback control system.

10. The vibration removing apparatus according to claim 9, wherein said producing means produces a pulse signal corresponding to a selected edge of said prediction signal.

11. The vibration removing apparatus according to claim 10, wherein said producing means comprises:

generation means for generating a series of differentiated pulses of the said driving signal; and selecting means for selecting one or more of differentiated pulses from the series of differentiated pulses generated by said generation means, to be outputted as a pulse signal.

12. The vibration removing apparatus according to claim 11, wherein said selecting means changes the differentiated pulse which has been selected from said series of differentiated pulses, in accordance with the characteristics of a device placed on said vibration removing table.

13. The vibration removing apparatus according to claim 10, wherein said producing means produces the pulse signal when triggered by a selected edge of said prediction signal.

14. The vibration removing apparatus according to claim 13, wherein said producing means comprises setting means for setting a time width and/or a peak value of pulse signals to be produced.

15. The vibration removing apparatus according to claim 14, wherein said setting means sets a time width and/or a peak value for each of the produced pulse signals to be produced by said producing means.

16. The vibration removing apparatus according to claim 9, wherein said feedback control system comprises a converter for converting an operation signal to electric power required for driving the air-spring, and.

wherein said input means adds the pulse signal, produced by said producing means, to a preceding stage of said converter.

17. The vibration removing apparatus according to claim 9, wherein said prediction means produces a prediction signal in accordance with a producing procedure of the prediction signal predeterminedly set based on a known driving process of the device placed on said vibration removing table, and a signal representing a driving status of the device.

18. A vibration removing method for removing vibrations of a vibration removing table, utilizing an air-spring controlled by a feedback control system which utilizes a signal based on a displacement of the vibration removing table, comprising the steps of:

producing a pulse signal corresponding to a selected edge of a driving signal of a device place on the vibration removing table; and inputting the pulse signal produced by said producing step as a feedforward signal in the feedback control system.

19. The vibration removing method according to claim 18, wherein said producing step comprises the steps of:

generating a series of differentiated pulses of the driving signal; and selecting one or more of the differentiated pulses from the series of differentiated pulses generated by said generating step, to be outputted as the pulse signal.

20. The vibration removing method according to claim 19, wherein in said selecting step, a series of differentiated pulses which has been selected from the series of differentiated pulses is changed in accordance with characteristics of the device placed on the vibration removing table.

21. The vibration removing method according to claim 18, wherein said inputting step further comprises the step of adding the pulse signal produced by said producing step to a preceding stage of a converter which converts an operation signal to electric power required for driving the air-spring in the feedback control system.

22. The vibration removing method according to claim 18, wherein in said producing step, pulse signals are produced when triggered by a selected edge of the driving signal.

23. The vibration removing method according to claim 22, wherein said producing step comprises a setting step for setting a time width and/or a peak value of the pulse signals to be produced.

24. The vibration removing method according to claim 23, wherein in said setting step, a time width and/or a peak value of pulse signals produced in said producing step is set for each of the produced pulse signals.

25. The vibration removing method according to claim 22, wherein in said input step, the pulse signal produced in said producing step is added to a preceding stage of a converter which converts an operation signal to electric power of the air-spring in the feedback control system.

26. A vibration removing method for removing vibrations of a vibration removing table, utilizing an air-spring controlled by a feedback control system which utilizes a signal based on a displacement of the vibration removing table, comprising the steps of:

generating a prediction signal corresponding to a driving signal of a device placed on the vibration removing table prior to generation of the driving signal;

producing a pulse signal based on the prediction signal; and inputting the pulse signal produced in said producing step as a feedforward signal in the feedback control system.

27. The vibration removing method according to claim 26, wherein in said producing step, a pulse signal corresponding to a selected edge of the prediction signal is produced.

28. The vibration removing method according to claim 27, wherein said producing step comprises the steps of:

generating a series of differentiated pulses of the driving signal, and selecting one or more of the differentiated pulses from the series of differentiated pulses generated in said generating step, to be outputted as the pulse signal.

29. The vibration removing method according to claim 28, wherein in said selecting step, a series of differentiated pulses which has been selected from said the series of differentiated pulses is changed in accordance with characteristics of the device placed the vibration removing table.

30. The vibration removing method according to claim 27, wherein in said producing step, pulse signals are produced when triggered by a selected edge of the prediction signal.

31. The vibration removing method according to claim 30, wherein said producing step comprises a setting step of setting a time width and/or a peak value of the pulse signals to be produced.

32. The vibration removing method according to claim 31, wherein in said setting step, a time width and/or a peak value of pulse signals produced in said producing step is set for each of the produced pulse signals.

33. The vibration removing method according to claim 26, wherein in said input step, the pulse signal produced in said producing step is added to a preceding stage of a converter which converts an operation signal to electric power of the air-spring in the feedback control system.

34. The vibration removing method according to claim 26, wherein in said generating step, a prediction signal is produced in accordance with a producing procedure of a prediction signal predeterminedly set based on a known driving process of the device placed on the vibration removing table, and a signal representing the driving status of the device.

* * * * *

UNITED STATES PATENT AND TRADEMARK OFFICE
CERTIFICATE OF CORRECTION

PATENT NO.   : 5,653,317
DATED        : August 5, 1997
INVENTOR(S)  : SHINJI WAKUI It is certified that error appears in the above-identified patent and that said Letters Patent is hereby corrected as shown below:

COLUMN 1

Line 21, "must be" should read --must be paid--.

COLUMN 2

Line 19, "control opening" should read --controls the opening--.

COLUMN 4

Line 6, "by" should read --by $f_{dis}$--.

Line 55, "becomes" should read --become--.

Line 66, "waveforms B indicates" should read --waveforms B and B' indicate--.

COLUMN 8

Line 16, "well" should read --well as--.

Line 33, "pulse," should read --pulses,--.

Line 41, "having" should be deleted.

Line 50, "6f" should read --of--.

Line 54, "output" should read --outputs--.

UNITED STATES PATENT AND TRADEMARK OFFICE
CERTIFICATE OF CORRECTION

PATENT NO. : 5,653,317

DATED :

INVENTOR(S) : August 5, 1997

SHINJI WAKUI

It is certified that error appears in the above-identified patent and that said Letters Patent is hereby corrected as shown below:

COLUMN 10

Line 21, "wave" should read --waves--.

Line 64, "platform" should read --platform,--.

COLUMN 11

Line 54, "Generation" should read --generation--.

COLUMN 12

Line 59, "comprising" should read --comprises--.

COLUMN 13

Line 19, "pulse" should read --pulses--.

COLUMN 14

Line 6, "and." should read --and--.

Line 23, "place" should read --placed--.

UNITED STATES PATENT AND TRADEMARK OFFICE
CERTIFICATE OF CORRECTION

PATENT NO. : 5,653,317
DATED : August 5, 1997
INVENTOR(S) : SHINJI WAKUI

It is certified that error appears in the above-identified patent and that said Letters Patent is hereby corrected as shown below:

COLUMN 15

Line 24, "said" should be deleted.

Line 26, "placed the" should read --placed on the--.

Signed and Sealed this

Thirty-first Day of March, 1998

Attest:

BRUCE LEHMAN

Attesting Officer

Commissioner of Patents and Trademarks